United States Patent [19]

Saito et al.

[11] Patent Number: 5,211,825
[45] Date of Patent: May 18, 1993

[54] PLASMA PROCESSING APPARATUS AND THE METHOD OF THE SAME

[75] Inventors: Katsuaki Saito; Takuya Fukuda; Michio Ohue, all of Hitachi; Tadasi Sonobe, Iwaki, all of Japan

[73] Assignee: Hitachi, Ltd., Tokyo, Japan

[21] Appl. No.: 764,161

[22] Filed: Sep. 23, 1991

[30] Foreign Application Priority Data

Sep. 21, 1990 [JP] Japan ................ 2-253398

[51] Int. Cl.⁵ .......................... B01J 19/12; C23F 4/04
[52] U.S. Cl. ........................ 204/192.32; 204/298.31; 204/298.33; 204/298.34; 204/298.37; 204/298.38; 156/345; 156/643; 118/723; 134/1
[58] Field of Search ............. 204/192.32, 298.31, 204/298.33, 298.34, 298.37, 298.38; 156/345, 643; 118/723; 134/1

[56] References Cited

U.S. PATENT DOCUMENTS

| | | | |
|---|---|---|---|
| 4,576,698 | 3/1986 | Gallagher et al. | 204/192.32 |
| 4,657,616 | 4/1987 | Benzing et al. | 156/345 |
| 4,816,113 | 3/1989 | Yamazaki | 156/643 |
| 4,960,488 | 10/1990 | Law et al. | 156/643 |
| 4,975,144 | 12/1990 | Yamazaki et al. | 156/643 |
| 4,989,540 | 2/1991 | Fuse et al. | 118/719 |
| 5,024,748 | 6/1991 | Fujimura | 204/298.38 |
| 5,084,125 | 1/1992 | Aoi | 156/345 |

FOREIGN PATENT DOCUMENTS

| | | | |
|---|---|---|---|
| 62-261125 | 11/1987 | Japan | 156/345 |
| 62-287623 | 12/1987 | Japan | 204/298.37 |
| 63-111177 | 5/1988 | Japan | 204/298.37 |
| 63-119225 | 5/1988 | Japan | 204/298.31 |
| 1-184827 | 7/1989 | Japan | 156/345 |
| 1-231320 | 9/1989 | Japan | 204/298.37 |
| 1-231321 | 9/1989 | Japan | 156/345 |

Primary Examiner—Aaron Weisstuch
Attorney, Agent, or Firm—Antonelli, Terry, Stout & Kraus

[57] ABSTRACT

A plasma processing apparatus performs a sample processing and cleaning processing. The sample processing is carried out by generating a reaction gas plasma within a vacuum vessel of the apparatus using an electron cyclotron resonance excitation. The cleaning processing is carried out to clean the inner wall of the vacuum vessel by generating a cleaning gas plasma within the vacuum vessel. Generation of the cleaning gas plasma takes place by using either one of the following processes:

(1) The plasma diameter during the cleaning processing is made larger than that during the sample processing. The end of the plasma during cleaning processing is made to reach the inside wall of the vacuum vessel.
(2) The cleaning gas plasma is scanned within the vacuum vessel.

17 Claims, 4 Drawing Sheets

PLASMA PROCESSING APPARATUS AND THE METHOD OF THE SAME

FIELD OF THE INVENTION

The present invention relates to a plasma processing apparatus which carries out a chemical vapor depositior (CVD) processing, and etching processing and a sputtering processing in a process for manufacturing semiconductor devices. More specifically, the present invention relates to a plasma processing apparatus having a function of cleaning an inner surface of the apparatus.

BACKGROUND OF THE INVENTION

Plasma products produced during CVD, etching and sputtering processing for manufacturing semiconductor devices in a plasma processing apparatus become fixed to an inner wall of a vacuum vessel in the plasma processing apparatus. For example, when silicon nitride (SiN) film is deposited on a sample surface using gases such as $SiH_4$ gas and $N_2$ gas or $NH_3$ gas which react to form SiN, silicon nitride or powdery silicon, which is produced by decomposition of residual $SiH_4$ becomes fixed or the inner surface of the reaction chamber of the apparatus. Further, when silicon oxide film or silicon nitride film is etched by a $CF_4$ gas plasma using a mask of photoresist, carbon fluoride caused by ionization decomposition from the gas is bonded with the photoresist and organic resin film is deposited on the inner wall of the vacuum vessel. When the deposited material fixed to the inner wall of the reaction chamber is peeled off, it causes problems in that processing conditions are changed, and the sample is contaminated by the peeled deposit.

It is known to periodically clean the reaction chamber of a plasma processing apparatus in such a manner that the deposit is etched by introducing gas containing a halogen element and generating plasma, or by ashing the deposit using oxygen plasma. It is necessary to generate the plasma near the cleaning portion so that the plasma reaches the portion to be cleaned or to expose ion current to the deposit for cleaning the deposit effectively. In this regard, many kinds of plasma processing apparatuses have been proposed, as follows.

For example, cleaning efficiency is enhanced by changing the incident direction of ions in such a manner that the magnetic field gradient in the reaction chamber is alternately inverted during the processing and cleaning of the reaction chamber, of by forming a cusp magnetic field as shown in FIGS. 3 and 4 of Japanese Patent Laid-Open No. 62-287623, respectively.

The cleaning efficiency of the reaction chamber is enhanced by providing a conductive protection wall at the inner wall of the reaction chamber. The conductive protection wall is able to apply a number of electrical potentials selectively and form divergent radiation of the plasma at the inner wall of the reaction chamber by the method disclosed in FIG. 1 of Japanese Patent Laid-Open No. 1-231320. Further, Japanese Patent Laid-Open No. 63-111177 discloses a method for cleaning effectively the desired portion of a reaction chamber by adjusting the plasma generating position thereby changing the cyclotron resonance point.

The above-mentioned prior art apparatuses have a drawback in that they do not consider how to effectively and uniformly clean the inside of the vacuum vessel and they are not able to effectively and uniformly clean within the vacuum vessel.

SUMMARY OF THE INVENTION

An object of the present invention is to provide a plasma processing apparatus which is able to effectively clean the inside of a vacuum vessel of the apparatus.

Another object of the present invention is to provide a plasma processing apparatus which is able to effectively and uniformly clean the inside of a vacuum vessel of the apparatus.

For attaining the above-mentioned ob.ect, the present invention is characterized in that sample processing takes place by generating reaction gas plasma within the vacuum vessel using electron cyclotron resonance excitation, cleaning processing of the vacuum vessel takes place by generating cleaning gas plasma within the vacuum vessel, and either one of the following processes takes place:

(1) The plasma diameter during cleaning processing is made larger than that during the sample processing and the end of the plasma during cleaning processing is made to reach the inside wall of the vacuum vessel.

(2) Cleaning gas plasma is scanned within the vacuum vessel.

By adopting the process mentioned in item (1), since the incident efficiency of a plasma species is enhanced to reach the additives or deposits within the vacuum vessel, effective cleaning can be carried out. By adopting the process mentioned in item (2), since the incident positions of a plasma species are varied continuously with respect to the inside wall of the vacuum vessel, cleaning of the inside wall of the vessel is carried out effectively and uniformly.

DETAILED DESCRIPTION OF THE PREFERRED EMBODIMENTS

Figure 1:
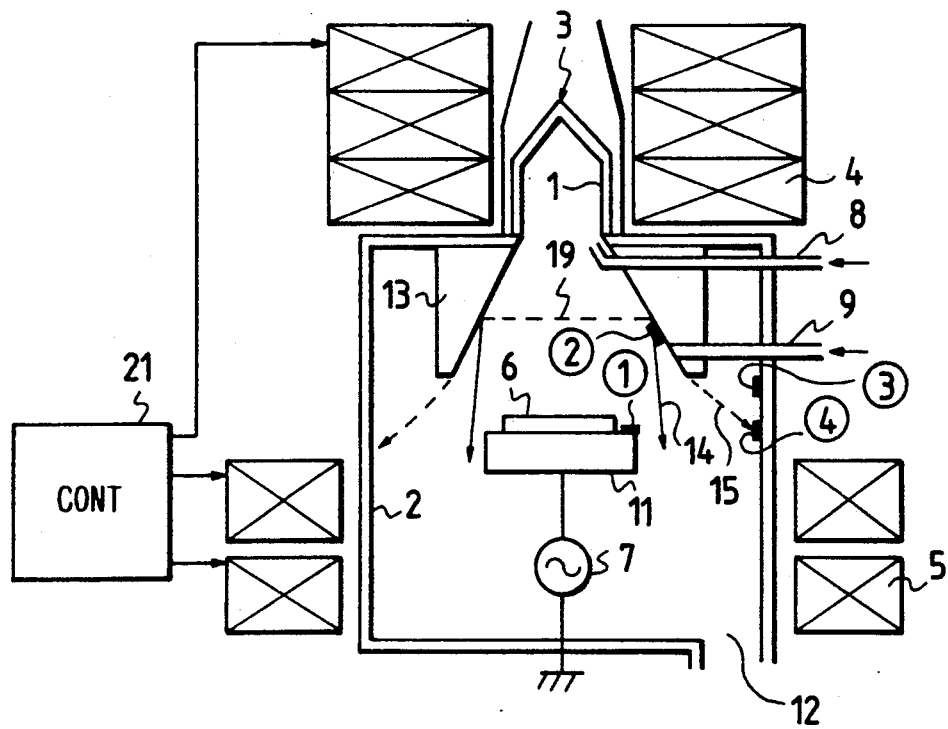
FIG. 1 illustrates a sectional view of the plasma processing apparatus of the first embodiment of the present invention.

Referring to FIG. 1, the plasma processing apparatus comprises a discharge tube 1 combined with an introduction window for microwaves 3, a reaction chamber 2, a sample holder 11 mounting the sample 6 such as a substrate, a high frequency power source 7 for applying a high frequency elertric field to the sample holder 11, a main magnetic field coil 4, a control magnetic field coil 5, a prevention tube 13 for preventing divergence of microwave 3 and maintaining the plasma production position caused by excitation of electron cyclotron resonance (ECR) in a predetermined position, gas supply tubes 8 and 9, and exhaust conduit 12 and a controller 21. The controller 21 detects the degree of opening of flow rate control devices (not shown) provided at the gas supply nozzles 8 and 9 and an output signal of a pressure detecting device (not shown) for detecting the pressure within the reaction chamber 2. The controller 21 also controls currents flowing through the main magnetic field coil 4 and the control magnetic field coil 5 in the range from +40 amperes to −40 amperes, and adjusts the degree of opening of flow rate control valves (not shown) of the cleaning gas and the exhaust gas.

The plasma processing apparatus induces ECR during sample processing by the electric field caused by microwaves 3 of 2.45 GHz and the magnetic field having a magnetic field density more than 875 gauss caused by excitation of the magnetic field coils 4 and 5 so that a cylindrical reaction gas plasma 14 is generated within the reaction chamber 2.

Hereunder, we will explain the embodiments of the present invention using the plasma processing apparatus.

Method No. 1 of the First Embodiment

Hereunder, we will explain the cleaning method after silicon nitride film is produced on the substrate 6.

The pressure within the vacuum vessel is adjusted to 0.3 Pascal (Pa) by introducing $N_2$ gas at a rate of 240 ml/min and $SiH_4$ at a rate of 24 ml/min, and adjusting the exhaust rate from the vacuum vessel. ECR surface 19 having a magnetic flux density of 875 gauss is generated within the prevention tube 13 of microwave radiation by introducing a microwaves 3 having an output of 600 W and adjusting the current to the magnetic field coils 4 and 5. A high frequency electric field having an output of 100 W is applied to the sample holder 11 by the high frequency electric source 7.

By the above-mentioned operation, a cylindrical ECR plasma 14 is generated such that the magnetic lines of force thereof are nearly perpendicular to the substrate 6. A SiN film having a thickness of 350 nm is formed at the surface of the substrate 6 by the irradiation of the plasma 14 for 60 sec.

At this time, the deposition thicknesses of the SiN films at the following four points within the vacuum vessel are as follows:

① on sample holder 11 . . . 340 nm
② near the inlet of $SiH_4$ . . . 225 nm
③ inside wall of the vacuum vessel . . . 65 nm
④ inside wall of the vacuum vessel . . . 52 nm When the SiN film is deposited on the substrate 6 at the thickness of 350 nm, the SiN films are adhered at each position ① to ④ as mentioned above, although the plasma is cylindrical and arranged on the substrate such that the substrate is made the bottom surface thereof.

After the SiN films are deposited as mentioned above, $NF_3$ gas is introduced to the reaction chamber 2 by the gas nozzle 8 as a cleaning gas. Cleaning velocities at the four locations of ① to ④ mentioned above are shown in the following table 1 for each of two kinds of plasma, Ⓐ and Ⓑ used under the following conditions: p0 Ⓐ Cylindrical plasma 14 is generated in the manner mentioned above.

Ⓑ Divergent plasma 15 is generated by currents flowing through the magnetic field coils 4 and 5 which are adjusted such that the end of the plasma reaches the inside wall of the vacuum vessel 2.

The plasma generating conditions at the time are that the flow rate of $NF_3$ is 150 ml/min, the microwave strength is 600 W, and the reaction pressure within the vacuum vessel is 0.3 Pa.

TABLE 1

| shapes of plasma | cleaning velocity (nm/min) position | | | |
|---|---|---|---|---|
| | ① | ② | ③ | ④ |
| cylindrical | 250 | 180 | 25 | 30 |
| divergent plasma | 230 | 210 | 80 | 95 |

As apparent from the Table 1, the cleaning velocities at the inside walls ③ and ④ of the vacuum vessel are 25 to 30 nm/min with the cylindrical plasma and 80 to 95 nm/min with the divergent plasma. Thus, when the divergent plasma is used, the cleaning velocity is two to three times compared with that of the cylindrical plasma.

Accordingly, the cleaning velocity is remarkably increased by broadening the diameter of the plasma during the cleaning processing time as compared with that during the substrate processing time and by making the end of the broadened plasma reach the inside wall of the vacuum vessel during the cleaning processing time so as to enhance the incident efficiency of the plasma species to the adhesions within the vacuum vessel.

METHOD NO. 2 OF THE FIRST EMBODIMENT

Hereunder, we will explain the cleaning method after $SiO_2$ film is deposited on the substrate 6 using the apparatus explained in the above-mentioned Method No. 1 of the first embodiment.

At first, the $SiO_2$ film is formed by introducing $O_2$ gas from the gas nozzle 8 at a flow rate of 240 ml/min and $SiH_4$ from the gas nozzle 9 at a flow rate of 24 ml/min, and making the other conditions as in the above-mentioned Method No. 1 of the first embodiment.

Next, the cleaning efficiency of $SiO_2$ deposits is monitored by generating the cylindrical plasma and the divergent plasma as in the above-mentioned embodiment. At the same time, cleaning efficiency is monitored under the condition that a high frequency electric field of 400 KHz and having an output of 100 W is applied to the sample holder 11. The result is shown in the following Table 2.

TABLE 2

| shapes of plasma | cleaning velocity (nm/min) position | | | |
|---|---|---|---|---|
| | ① | ② | ③ | ④ |
| cylindrical plasma (high frequency O W) | 131 | 100 | 3 | 4 |
| divergent plasma (high frequency O W) | 126 | 121 | 72 | 90 |

TABLE 2-continued

| shapes of plasma | cleaning velocity (nm/min) position | | | |
|---|---|---|---|---|
| | ① | ② | ③ | ④ |
| divergent plasma (high frequency 100 O W) | 240 | 121 | 78 | 93 |

As apparent from the table 2, cleaning efficiency is increased by using the divergent plasma in which the diameter of the plasma is broadened in case of cleaning SiO2 deposits within the vacuum vessel. Cleaning efficiencies at the positions to which the electric fields are applied are increased more in comparison with other positions to which electric fields ar not applied. In other words, increasing the amount of ions incident the deposits within the vacuum vessel is effective for cleaning of the oxidized film.

The Second Embodiment

The apparatus of the first embodiment is used to form a Cr film on a surface of a glass substrate. Thereafter, a SiN film having a thickness of 350 nm is deposited on the film on the glass substrate using the same apparatus. The inside of the vacuum vessel is cleaned by NF3 gas after the deposition of the Cr film but before deposition of the SiN film. After deposition of the SiN film, intrinsic amorphous Si film and N type amorphous Si film are consecutively formed on the SiN film of the glass substrate 6 using another apparatus to produce a thin film transistor (TFT). The mobilities of each transistor are then checked by a well known method.

As a result, one transistor which is produced before the cleaning is performed has a mobility of 0.6 cm²/Vsec. On the other hand, another transistor which is produced after the cleaning is performed has a mobility of 0.3 cm²/VSec. The transistor characteristic of the latter is inferior to that of the former. Much fluorine is detected within the SiN film of the transistor which is produced after the cleanirg has taken place.

Figure 2:
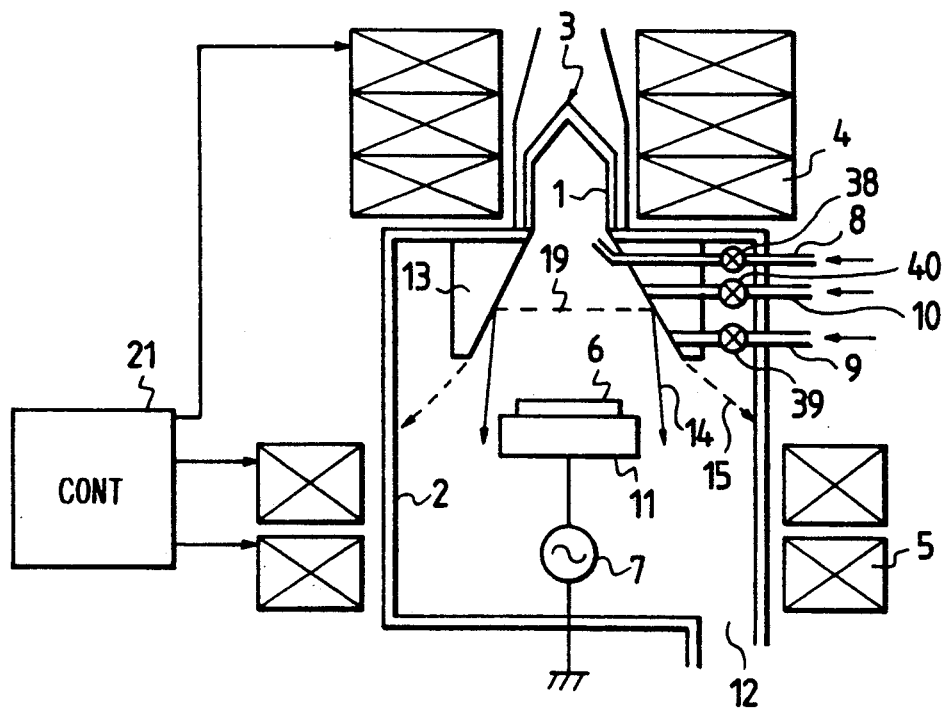
FIG. 2 illustrates a sectional view of the plasma processing apparatus of the second embodiment of the present invention.

Then, the apparatus of the embodiment of the present invention as shown in FIG. 2 is provided with a cleaning gas nozzle 10 for introducing the NF3 cleaning gas. Shut-off valves 38, 39, and 40 of the respective nozzles 8, 9, and 10 are located near the inlets within the vacuum vessel. The apparatus is cleaned by shutting the shut-off valves 38 and 39 during the cleaning time, when cleaning gas is introduced via nozzle 10 and valve 40. The apparatus is used to produce the transistor by shutting the shut-off valve 40 when the film is made. By the above-mentioned manufacturing process of the embodiment, the mobility of the transistor so made is 0.6 cm²/Vsec.

As apparent from the above-mentioned experiment, even if the substrate is processed immediately after the cleaning, a thin film having excellent characteristics is made by providing an exclusive nozzle for the cleaning gas, and removing effectively the influence of the residual gasses of each nozzle during of the glass substrate processing and the cleaning.

The Third Embodiment

Referring to FIG. 3, the apparatus of the third embodiment is characterized in that the magnetic field direction of the control magnetic field coil 5 during the cleaning processing of the vacuum vessel is controlled to be reverse that during the film processing time of the transistor, a cusp field is generated within the vacuum vessel by the magnetic fields caused by the main magnetic field coil 4 and the control magnetic field coil 5, and the deposits within the vacuum vessel are cleaned by the reaction gas which is in a plasma state as a result of the cusp field.

At first, SiO2 is deposited on the substrate 6 from O2 gas and SiH4 gas and SiH4 gas, and generating the cylindrical plasma 14 on the bottom surface of the substrate 6.

When cleaning is to take place, NF3 gas is introduced from the cleaning gas supply nozzle 10 as the cleaning gas, the cusp field is generated by controlling the main magnetic field coil 4 and the control magnetic field coil 5, and the inside wall of the vacuum vessel is cleaned by the NF3 plasma.

Figures 3A, 3B:
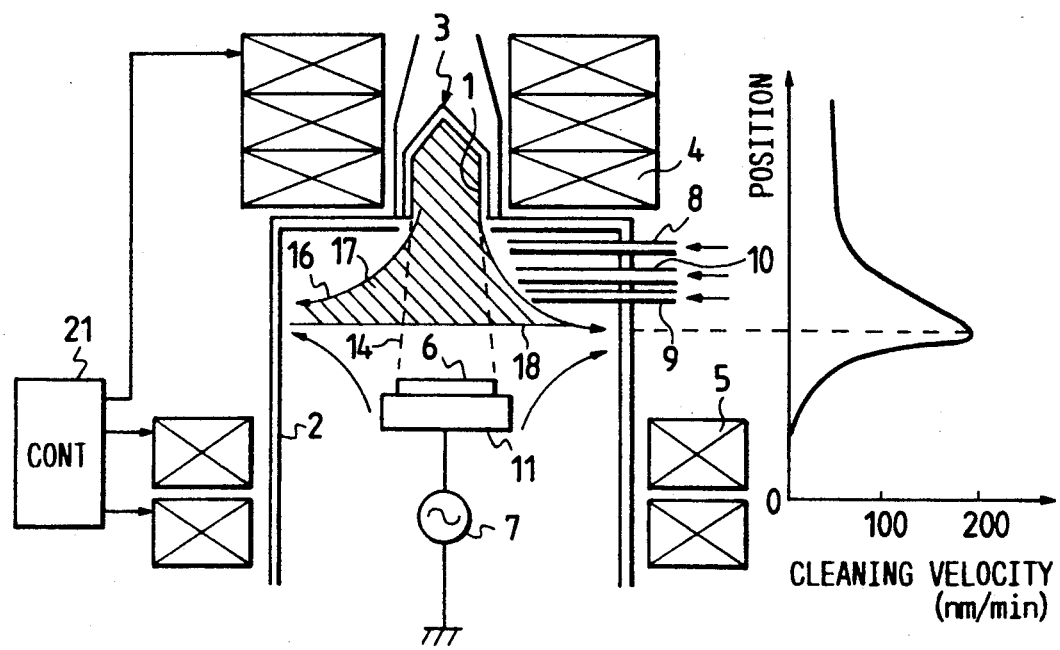
FIG. 3A illustrates a sectional view of the plasma processing apparatus of the third embodiment of the present invention.
FIG. 3B shows a characteristic between cleaning velocity and position of the plasma processing apparatus shown in FIG. 3A.

Since NF3 plasma 17 flows in the direction 16 of the vacuum vessel wall along the cusp magnetic field interface 18, the SiO2 deposits on the inside wall of the vacuum vessel are remarkably cleaned at high speed in the area of the inside wall corresponding to the interface 18. However, the lower inside wall portion of the vacuum vessel which the interface 18 does not cross experiences a rapidly decreasing cleaning velocity as shown by FIG. 3B.

The apparatus of the embodiment of the p:.esent invention is controlled in such a manner that the cusp field surface formed by the main magnetic field coil 4 and the control magnetic field coil 5 is scanned continuously between the main magnetic field coil 4 and the control magnetic field coil 5.

Figure 4:
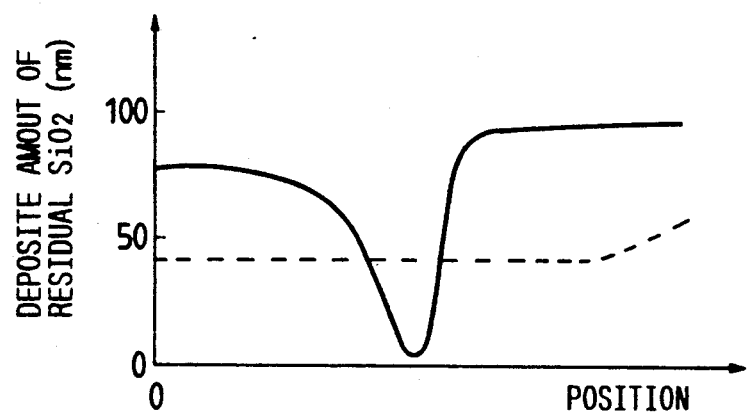
FIG. 4 shows a characteristic between position and residual $SiO_2$ deposit amount in the plasma processing apparatus shown in FIG. 3A.

FIG. 4 shows the residual SiO2 deposit amount when the cleaning has taken place by fixing the cusp magnetic field position in a predetermined position (solid line), and when the cleaning has taken place by scanning the cusp magnetic field position (dashed line). As apparent from FIG. 4, since the incident position of the plasma species to the adhesive is continuously varied by scanning the cusp magnetic field position, the inside wall of the vacuum vessel i cleaned uniformly.

The Fourth Embodiment

Figures 5A, 5B:
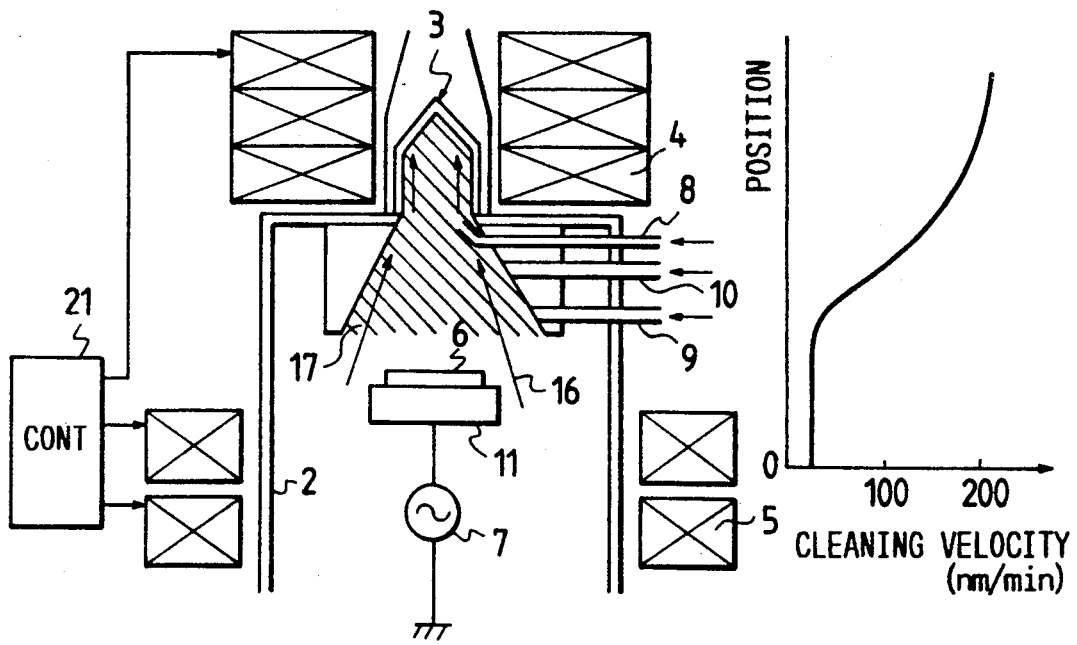
FIG. 5A illustrates a sectional view of the plasma processing apparatus of the fourth embodimert of the present invention.
FIG. 5B shows a characteristic between cleaning velocity and position in the plasma processing apparatus shown in FIG. 5A.

Referring to FIG. 5 illustrating the fourth embodiment, the magnetic field direction caused by the main magnetic field coil 4 and the magnetic field direction caused by the control magnetic field coil 5 during the cleaning processing time are controlled to be reverse to that at the time when the SiO2 film is deposited so that the plasma 16 generated toward the upper direction, and the upper portion of the apparatus is cleaned uniformly.

In the third embodiment, SiOx which is adhered near the discharge tube 1 of the upside position of the main magnetic field coil 4 cannot be cleaned uniformly. Hence, in this embodiment, after the main magnetic field coil 4 and the control magnetic field coil 5 are controlled continuously, the exciting current of the main magnetic field coil 4 is gradually lowered from the cusp magnetic field generating state as shown in the third embodiment, until the exciting current is zero, and then the exciting current is further lowered so as to invert the direction of the exciting current and generate the magnetic field 16 so that it is directed toward the upper direction as shown in FIG. 5.

Further, the magnetic field distributirn is continuously varied such that the magnetic field direction provided by the main magnetic field coil 4 and the control magnetic field coil 5 are inverted, and the incident position of the plasma species relative to the inside wall of the vacuum vessel is changed continuously so that the inside of the vacuum vessel is cleaned uniformly.

According to the present embodiment, since the upper portion of the apparatus is cleaned speedily, SiOx adhered near the discharge tube 1 is cleaned effectively and uniformly.

The Fifth Embodiment

Figure 6:
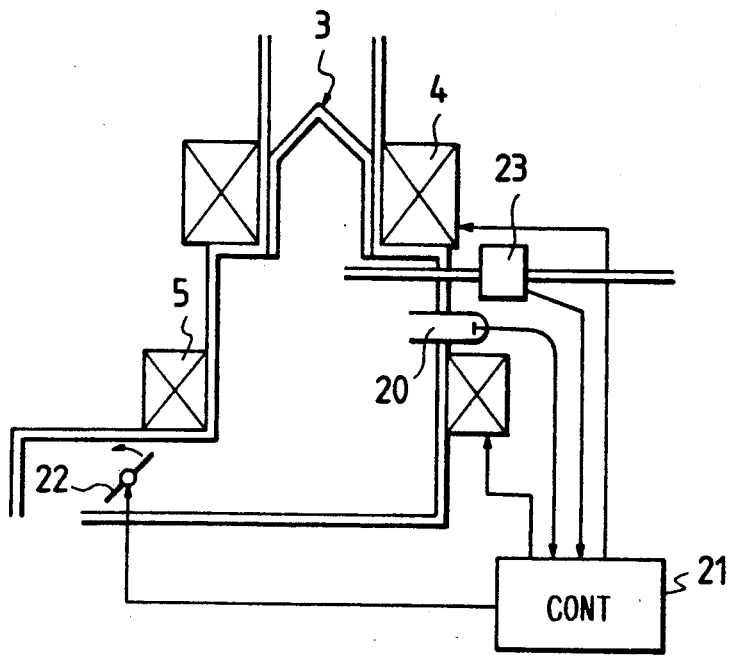
FIG. 6 illustrates a sectional view of the plasma processing apparatus of the fifth embodiment of the present invention.
Figure 7:
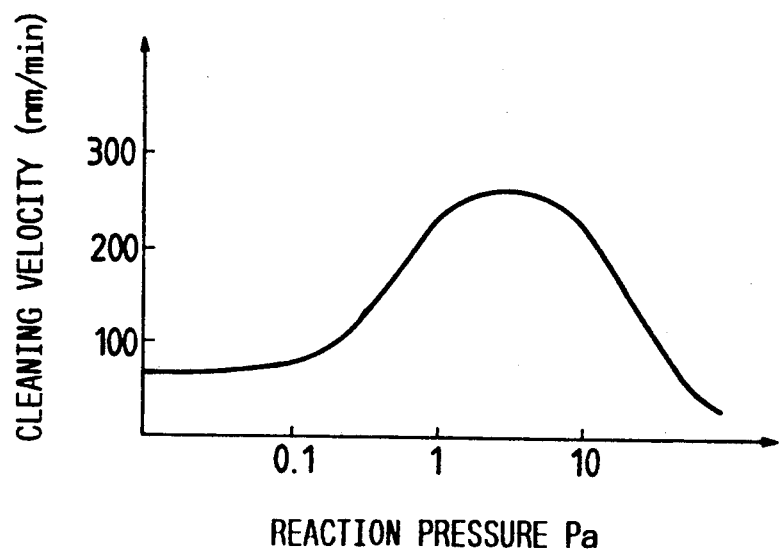
FIG. 7 shows a characteristic between reaction pressure and cleaning velocity of the plasma processing apparatus shown in FIG. 6.

Referring to FIG. 6 showing the fifth embodiment of the present invention, the plasma processing apparatus comprises a flow rate adjustment device 23 for detecting the flow rate of the cleaning gas (NF$_3$) and adjusting thereof and a pressure detecting device 20 for detecting the pressure within the vacuum vessel. The control device 21 detects the output signals of the flow rate adjusting device 23 and the pressure detecting device 20 and adjusts currents flowing through the main magnetic field coil 4 and the control magnetic field coil 5, the cleaning gas flow rate and degree of opening of the exhzust gas valve 22. Although the nozzles 8 and 9 for supplying the gas used for depositing film on the substrate (not shown) are not shown in FIG. 6, they are provided, as well as the cleaning gas supply nozzle 10. With reference to FIG. 7, it is seen that the cleaning velocity with the apparatus of FIG. 6 is fastest when the reaction pressure is about 2 Pa.

The apparatus shown in the embodiment selects 2 Pa as the reaction pressure during cleaning to obtain the fastest cleaning velocity, and the control device 21 adjusts the cleaning gas flow rate and the degree of opening of the exhaust gas valve 22 so that the reaction pressure during the cleaning processing time is always 2 Pa. At the same time, the control device 21 controls the main magnetic field coil 4 and the control magnetic field coil 5 to generate the magnetic field for generating the plasma having a proper shape for the cleaning procedure as explained in the above-mentioned embodiments.

In the above-embodiment, NF$_3$ gas containing a halogen element is used as the cleaning gas. The inventors determined that when oxygen is used as the cleaning gas, the cleaning velocity is fastest in the case of the reaction pressure being approximately $7 \times 10^{-3}$ Pa. According to the embodiment, the cleaning procedure can be done under the most suitable conditions.

The Sixth Embodiment

Figure 8:
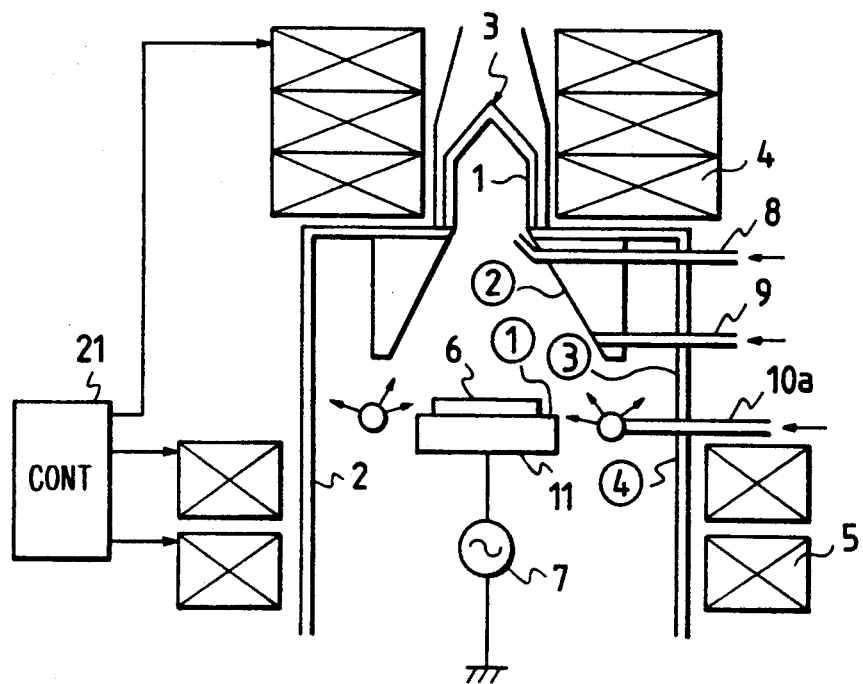
FIG. 8 illustrates a sectional view of tha plasma processing apparatus of the sixth embodiment of the present invention.

Referring to FIG. 8 depicting the sixth embodiment, the plasma processing apparatus is characterized in that the inlet of the cleaning gas supply nozzle 10a is provided near the sample holder 11. The result of the cleaning processing using the apparatus shown in FIG. 8 is shown by the following Table 3. Points ① to ④ shown in FIG. 8 correspond to those shown in FIG. 1. And the cleaning condition of the sixth embodiment is same as that of the first embodiment in which the divergent plasma is used.

TABLE 3

| shapes of plasma | cleaning velocity (nm/min) position | | | |
|---|---|---|---|---|
| | ① | ② | ③ | ④ |
| divergent plasma | 350 | 180 | 130 | 150 |

As apparent from the Table 3, the apparatus of the embodiment has a lower cleaning velocity near the reaction gas inlet ②, and remarkably increased cleaning velocities on the sample holder ① and within the vacuum vessel ③ and ④ compared with the embodiment of the Table 1 where the divergent plasma is used.

The Seventh Embodiment

In each embodiment mentioned above, the present invention is applied to a CVD apparatus. However, the present invention is not limited to the CVD apparatus. For example, the present invention can be applied to an etching apparatus.

When the apparatus explained in FIG. 1 is used as an etching apparatus and CF$_4$ gas is used as an etching gas for etching a Si substrate 6, carbon becomes adhered to the apparatus at the positions ① to ④ shown in FIG. 1. When oxygen gas is used as the cleaning gas and the cylindrical plasma and the divergent plasma are generated as well, as in the above-mentioned embodiments, the cleaning velocity is as shown in Table 4.

TABLE 4

| shapes of plasma | cleaning velocity (nm/min) position | | | |
|---|---|---|---|---|
| | ① | ② | ③ | ④ |
| cylindrical plasma (high frequency 0 W) | 120 | 90 | 10 | 13 |
| divergent plasma (high frequency 0 W) | 110 | 100 | 30 | 50 |
| divergent plasma (high frequency 100 W) | 160 | 100 | 30 | 50 |

As apparent from the Table ④, when the divergent plasma is used for cleaning the ③ and ④ portions of ths vacuum vessel in case of the etching cleaning, the cleaning velocity using the divergent plasma is fast compared with the cylindrical plasma.

When a high frequency magnetic field having a frequency of 400 KHz and an output of 100 W is applied to the sample holder 11, the cleaning velocity using the divergent plasma is fast compared with that using the cylindrical plasma.

As apparent from the explanation given above, since the present invention is constituted in such a manner that the plasma diameter during cleanong processing is larger that during sample processing and the plasma species during cleaning processing reaches the inside wall of the vacuum vessel, the cleaning velocity is increased and effective cleaning processing can be performed.

Further, the incident position of the plasma species on the inside wall of the vacuum vessel is scanned by controlling the main magnetic field coil current and the control magnetic field coil current and the control magnetic field current during cleaning processing time so that the inside of the vessel is cleaned uniformly and effectively.

What we claim is:

1. A plasma processing apparatus which carries out a sample processing by generating a reaction gas plasma within a vacuum vessel using an electron cyclotron resonance excitation and a cleaning processing of an inner wall of the vacuum vessel by generating a cleaning gas plasma within the vacuum vessel, comprising:

a reaction gas supply nozzle for supplying a reaction gas within said vacuum vessel;

a main magnetic field coil for generating a magnetic field used for cyclotron resonance at a plasma generating region within said vacuum vessel;

a control magnetic field coil for generating another magnetic field used for controlling a plasma wave at a plasma reaction region within said vacuum vessel;

a sample holder for supplying said sample at said plasma reaction region; and an excitation control means for generating selectively either a cylindrical plasma or a divergent plasma, a maximum plasma diameter of the divergent plasma being larger than that of the cylindrical plasma, wherein said excitation control means generates a cylindrical reaction gas plasma during said sample processing and a divergent cleaning gas plasma during said cleaning procedure.

2. A plasma processing apparatus which carries out a sample processing by generating a reaction gas plasma within a vacuum vessel using an electron cyclotron resonance excitation and a cleaning processing of an inner wall of the vacuum vessel by generating a cleaning gas plasma within the vacuum vessel, comprising:

a reaction gas supply nozzle for supplying a reaction gas within said vacuum vessel;

a main magnetic field coil for generating a magnetic field for cyclotron resonance at a plasma generating region within said vacuum vessel;

a control magnetic field coil for generating another magnetic field used for controlling a plasma wave at a plasma reaction region within said vacuum vessel;

a sample holder for supplying said sample at said plasma reaction region; and a cusp magnetic field generating means for generating a cusp magnetic field between said main magnetic field coil and said control magnetic field coil during a cleaning procedure of said vacuum vessel by changing over the magnetic field direction during a sample processing caused by said control magnetic field coil to an inverse direction thereof so that a cleaning gas plasma is generated by the cusp magnetic field, and for scanning an interface of the cusp magnetic field between said main magnetic field coil and said control magnetic field coil by controlling continuously either said main magnetic field coil and said control magnetic field coil.

3. A plasma processing apparatus which carries out a sample processing by generating a reaction gas plasma within a vacuum vessel using an electron cyclotron resonance excitation and a cleaning processing of an inner wall of the vacuum vessel by generating a cleaning gas plasma within the vacuum vessel, comprising:

a reaction gas supply nozzle for supplying a reaction gas within said vacuum vessel;

a main magnetic field coil for generating a magnetic field used for cyclotron resonance at a plasma generating region within said vacuum vessel;

a control magnetic field coil for generating another magnetic field used for controlling a plasma wave at a plasma reaction region within said vacuum vessel;

a sample holder for supplying said sample at said plasma reaction region;

a changeover means for changing over the magnetic field directions of said main magnetic field coil and said control magnetic field coil to inverse directions during a time of a processing; and an excitation control means for changing continuously a magnetic field distribution caused by said main magnetic field coil and said control magnetic field coil.

4. A plasma processing apparatus according to claim 1, further including:

a flow rate adjusting means for adjusting the flow rate of said cleaning gas after detecting the flow rate;

a pressure detecting means for detecting the pressure within said vacuum vessel; and a pressure control means for controlling either a reaction gas flow rate or an exhaust gas flow rate, and maintaining the pressure within said vacuum vessel at a predetermined value.

5. A plasma processing apparatus according to claim 2, further including:

a flow rate adjusting means for adjusting the flow rate of said cleaning gas after detecting the flow rate;

a pressure detecting means for detecting the pressure within said vacuum vessel; and a pressure control means for controlling either a reaction gas flow rate or an exhaust gas flow rate, and maintaining the pressure within said vacuum vessel at a predetermined value.

6. A plasma processing apparatus according to claim 3, further including:

a flow rate adjusting means for adjusting the flow rate of said cleaning gas after detecting the flow rate;

a pressure detecting means for detecting the pressure within said vacuum vessel; and a pressure control means for controlling either a reaction gas flow rate or an exhaust gas flow rate, and maintaining the pressure within said vacuum vessel at a predetermined value.

7. A plasma processing apparatus according to claim 1, further including:

a cleaning gas supply nozzle for supplying a cleaning gas to said vacuum vessel; and an interrupting means for interrupting passage of the reaction gas between for inside of said vacuum vessel and the reaction gas supply nozzle.

8. A plasma processing apparatus according to claim 2, further including:

a cleaning gas supply nozzle for supplying a cleaning gas to said vacuum vessel; and an interrupting means for interrupting passage of the reaction gas between the inside of said vacuum vessel and the reaction gas supply nozzle.

9. A plasma processing apparatus according to claim 3, further including:

a cleaning gas supply nozzle for supplying a cleaning gas to said vacuum vessel; and an interrupting means for interrupting passage of the reaction gas between the inside of said vacuum vessel and the reaction gas supply nozzle.

10. A plasma processing apparatus according to claim 7, wherein an inlet of said cleaning gas supply nozzle is provided near said sample holder of said vacuum vessel.

11. A plasma processing apparatus according to claim 8, wherein an inlet of said cleaning gas supply nozzle is provided near said sample holder of said vacuum vessel.

12. A plasma processing apparatus according to claim 9, wherein an inlet of said cleaning gas supply nozzle is provided near said sample holder of said vacuum vessel.

13. A plasma processing apparatus according to claim 1, further including:

means for applying a high frequency electrical field to said sample holder.

14. A plasma processing apparatus according to claim 2, further including:

means for applying a high frequency electrical field to said sample holder.

15. A plasma processing apparatus according to claim 3, further including
    means for applying a high frequency electrical field to said sample holder.

16. A plasma processing method which carries out a sample processing by generating a reaction gas plasma within a vacuum vessel using an electron cyclotron resonance excitation and a cleaning processing of an inner wall of the vacuum vessel by generating a cleaning gas plasma within the vacuum vessel, wherein a maximum plasma diameter of a surface which is parallel to the sample surface during a cleaning procedure is larger than the maximum plasma diameter of the surface which is parallel to the sample surface during sample processing, and the end of the maximum plasma diameter during the cleaning procedure reaches to an inner wall of said vacuum vessel.

17. A plasma processing method according to claim 16, wherein said cleaning gas plasma is scanned within said vacuum vessel.

* * * * *